United States Patent
Wurmhöringer

(10) Patent No.: US 8,215,243 B2
(45) Date of Patent: Jul. 10, 2012

(54) RACK FOR A TEST CELL

(75) Inventor: Klaus Wurmhöringer, Jettingen (DE)

(73) Assignee: Hawa GmbH & Co. KG, Wain (DE)

( * ) Notice: Subject to any disclaimer, the term of this patent is extended or adjusted under 35 U.S.C. 154(b) by 225 days.

(21) Appl. No.: 12/468,352

(22) Filed: May 19, 2009

(65) Prior Publication Data

US 2009/0289020 A1    Nov. 26, 2009

(30) Foreign Application Priority Data

May 21, 2008    (EP) .................................. 08 009 356

(51) Int. Cl.
*A47B 37/00* (2006.01)
(52) U.S. Cl. .................. 108/50.02; 312/223.6
(58) Field of Classification Search ................. 108/106, 108/110, 193, 50.02, 50.01; 211/41.12, 191; 174/50; 312/265.3, 265.1, 265.4, 223.6, 312/223.1
See application file for complete search history.

(56) References Cited

U.S. PATENT DOCUMENTS

| | | | | |
|---|---|---|---|---|
| 3,050,194 A * | 8/1962 | Sinninger | ..................... | 108/106 |
| 3,461,349 A * | 8/1969 | Meyer | ............................. | 174/50 |
| 3,506,138 A * | 4/1970 | Travis | ........................... | 108/190 |
| 4,643,319 A * | 2/1987 | Debus et al. | .................. | 211/189 |
| 5,165,770 A * | 11/1992 | Hahn | ......................... | 312/265.4 |
| 5,237,935 A * | 8/1993 | Newhouse et al. | ........ | 108/50.02 |
| 5,357,874 A * | 10/1994 | Palmer | ....................... | 108/50.02 |
| 5,606,919 A * | 3/1997 | Fox et al. | .................... | 108/50.02 |
| 5,761,797 A * | 6/1998 | Besserer et al. | ............... | 29/825 |
| 5,788,087 A * | 8/1998 | Orlando | .......................... | 211/26 |
| 5,921,795 A * | 7/1999 | Weener et al. | ................ | 439/215 |
| 5,957,556 A * | 9/1999 | Singer et al. | ............... | 312/223.6 |
| 5,988,076 A * | 11/1999 | Vander Park | .............. | 108/50.02 |
| 6,019,446 A | 2/2000 | Laboch et al. | | |
| 6,086,028 A * | 7/2000 | Pfister | ....................... | 108/50.01 |
| 6,246,004 B1 | 6/2001 | Faccin | | |
| 6,293,637 B1 * | 9/2001 | Anderson et al. | .......... | 312/265.1 |
| 6,425,488 B1 * | 7/2002 | Notohardjono et al. | ... | 312/265.1 |
| 6,450,350 B1 * | 9/2002 | Krummell, Jr. | ............... | 211/191 |
| 6,481,582 B1 * | 11/2002 | Rinderer | .................... | 312/265.4 |
| 6,605,777 B1 * | 8/2003 | Anderson et al. | .............. | 174/50 |
| 7,124,903 B2 * | 10/2006 | Gruber et al. | ................. | 211/189 |

(Continued)

FOREIGN PATENT DOCUMENTS

DE    202 07 426    5/2002

(Continued)

OTHER PUBLICATIONS

European Search Report for corresponding Application No. EP 08 009356 dated Nov. 28, 2008.

*Primary Examiner* — Jose V Chen
(74) *Attorney, Agent, or Firm* — Renner, Otto, Boisselle & Sklar, LLP

(57) ABSTRACT

A rack for a test cell, with vertical posts and horizontal crossbars, wherein the crossbars are connected with their end sections to the posts. The posts and the crossbars have the form of box sections that are open towards the outside, are arranged in a spatial grid, and are connected with each other. The posts as well as the crossbars have passages that are associated with each other and that serve as passages for lines that are installed in the rack.

19 Claims, 2 Drawing Sheets

U.S. PATENT DOCUMENTS

| | | | |
|---|---|---|---|
| 7,259,326 B2 * | 8/2007 | Nguyen | 174/50 |
| 7,634,967 B1 * | 12/2009 | Albright et al. | 108/50.02 |
| 7,665,255 B2 * | 2/2010 | Dressendorfer et al. | 108/50.02 |
| 7,772,489 B2 * | 8/2010 | Adducci et al. | 174/50 |
| 2003/0048048 A1 | 3/2003 | Altena | |
| 2005/0028708 A1 * | 2/2005 | Lu et al. | 108/50.02 |
| 2006/0157436 A1 * | 7/2006 | Iwamoto | 211/191 |
| 2010/0193452 A1 * | 8/2010 | Kotaki | 211/41.12 |

FOREIGN PATENT DOCUMENTS

| | | |
|---|---|---|
| EP | 0 866 531 | 9/1998 |
| EP | 0 932 231 | 7/1999 |
| FR | 2 761 569 | 10/1998 |
| WO | 03/012947 | 2/2003 |

* cited by examiner

RACK FOR A TEST CELL

CROSS-REFERENCE TO RELATED APPLICATION

The present application claims priority under 35 USC §119 to European Patent Application No. 08 009 356.0, filed on May 21, 2008, the entire disclosure of which is incorporated herein by reference.

TECHNICAL FIELD OF THE INVENTION

The invention concerns a rack for a test cell with vertical posts and horizontal crossbars, wherein the crossbars are connected with their end sections to the posts. Test cells are also often commonly referred to as test stands and include at least one testing apparatus, technical supply devices, and frequently also integrated instruments. The technical supply devices, the testing apparatus, and the instruments are interconnected with electrical, pneumatic and/or hydraulic lines; the electrical lines may include voltage supply, control, and sensor lines.

DESCRIPTION OF THE RELATED ART

In the field, racks are widely used for carrying testing devices. Such racks usually comprise at least four vertical posts and a number of horizontal crossbars, with the posts and crossbars arranged perpendicular to each other. The horizontal crossbars are attached to the vertical posts permanently or non-permanently by means of a bolted, press-fit, or welded connection, with the crossbars being connected to the vertical posts with their end sections. In a rack of this type, support panels for testing apparatus and/or shelf panels for instruments that are held by the posts and/or the crossbars are commonly provided.

The design patent DE 202 07 426 U1 discloses a rack for a cabinet, specifically for an apparatus and control cabinet that has a lower and an upper frame as well as front and rear vertical profile elements. The vertical profile elements have the form of hollow sections and connect the lower with the upper frame. In terms of their cross-section, the front vertical profile elements and the rear profile elements are provided as open multi-chamber profile elements, with at least the rear vertical profile elements being designed to serve as cable channels.

Test cells are used primarily in manufacturing and in laboratories. These cells require the line installation to be as orderly and clear as possible; above all, it must meet the regulations regarding occupational safety and technical safety. Frequently, however, the components of the test cells are interconnected by means of free-hanging overhead or exposed lines. In some cases, the lines are also attached to one or several of the vertical posts of the rack. Such line arrangements often do not comply with safety standards and, above all, no longer meet the high requirements for a test cell regarding the ease of its operation and its overall aesthetic appearance.

Therefore, the invention addresses the problem of proposing a rack that is economical to manufacture and permits a flexible and orderly arrangement of lines, with the lines covered as much as possible, and that is in compliance with work safety and technical safety regulations.

SUMMARY OF THE INVENTION

According to the invention, this problem is solved.

It is the basic idea of the invention to run the lines of the test cell not only in the vertical posts of the rack but also in the horizontal crossbars. The posts and the crossbars are connected to form a mechanically sturdy rack that is capable of carrying heavy testing apparatus and instruments.

In the rack according to the invention, the posts and the crossbars have the form of box sections that are open towards the outside. They form cable channels for holding electrical cables and/or lines for liquid or gaseous media. The crossbars are arranged in a spatial grid with the posts and are connected with the posts with the face sides of their end sections.

The horizontal crossbars in the form of transverse and side crossbars are non-permanently connected with the posts, preferably by means of bolts. This allows for a modular construction with the crossbars and the posts as corner posts and, if required, additional intermediate posts, in a given grid. Varying the length of the horizontal transverse and/or side crossbars makes the rack suitable for various types of applications. Swivel rollers may be provided on the rack, preferably at the corner posts, in order to ensure the mobility of the test cell. For the vertical posts and the horizontal crossbars, bent sheet metal pieces or extruded single or multi-chamber profile elements made of metal that form the cable channels can be used as self-supporting open box sections.

Advantageously, at the face side of the two end sections, the box sections of the crossbars have end plates that are permanently attached to the box section. Together with the box section, the end plates form a box element. Preferably, the end plates are made of the same material as the box sections and are fixed to the box section, non-permanently or permanently, by means of suitable attachment methods that are commonly used in the industry.

Expediently, the box sections that are open towards the outside are accessible from the outside of the rack, and the rear walls of the profile elements and/or the box elements face the interior of the rack. It is an advantage that the open box sections can be made in a simple way, and therefore economically, by bending sheet metal, for example. The end plates that turn the profile elements into box elements act like ribs, giving the box elements a high rigidity. At the same time, the open profile design makes it possible to install lines, for example for the electrical power supply or for conveying gaseous or liquid media, in the vertical and horizontal box sections or box elements. The installation is simple and quick, the arrangement of the lines can be altered at any time, and the lines are protected and arranged in an orderly fashion.

Preferably, at their end plates and their rear walls facing the interior of the rack, the box elements have passages for the lines to be installed. In addition, in a preferred implementation, and at the attachment points for the box elements, the vertical posts have passages for the lines that are associated with the passages in the end plates of the box elements. This makes it possible to run the lines from the posts through the passages of the posts and the passages in the end plates of the box elements that, as crossbars, connect the posts to form a rack, and from there through passages in the rear walls of the box elements into the interior of the rack, without exiting from the rack towards the outside at any point. Even at the joints of the rack where the crossbars meet the posts, the lines run inside the profile elements through the passages and do not exit from them.

In an embodiment of the invention, the posts and/or the box elements has standard lengths. This makes a modular and economic construction of the rack of the test cell possible.

Due to the various standard lengths, the size of the interior space of the rack can be varied. Said standard lengths may comply with the industrial standards for the dimensions of housings for electrical devices. It also offers advantages if the width and depth dimensions of the posts and crossbars are standardized as well. The standardization of the components for the manufacture of the rack permits its economic mass production and stocking of the parts which shortens the time until the rack is available. A variable construction of the rack in different sizes to meet different requirements is nevertheless possible. In addition, the modular design also permits a later change of the interior space of the rack of an existing test cell.

In one embodiment of the invention, the rack holds a control cabinet with standardized dimensions that is preferably attached to the vertical posts. On the control cabinet, passages for lines are provided that correspond with the passages in the wall of the box elements and/or the passages in the wall of the posts.

The width and the height of the standardized control cabinets correspond with the standard length of the box elements and with the vertical grid of the attachment points on the posts. In principle, such a control cabinet may be placed on either side of the rack and thereby replace one or more crossbars. As from the posts into the crossbars, lines from or into the control cabinet can be run through the passages into the posts or crossbars with exiting.

In an embodiment of the invention, the rack has a support panel with a testing apparatus. Ideally, in the interest of good accessibility to the testing apparatus, the support panel is located in a central or upper section of the rack and, in case a control cabinet is provided, preferably above the integrated control cabinet. As a matter of expedience, the rack also has a shelf panel for instruments that is preferably located at an upper end of the posts, i.e. above the testing apparatus. The support panel and/or the shelf panel may be attached to the vertical posts and/or the horizontal crossbars. The dimensions of the support panel and of the shelf panel are also standardized.

For closing the box sections of the posts and of the crossbars that are open towards the outside, covers such as those commonly used for cable channels may be provided in the rack according to the invention. The covers protect the lines installed in the rack and improve the appearance of the test cell.

Below, the invention is explained in detail with reference to an embodiment shown in the drawing. Additional characteristics of the invention are given in the following description of the embodiment of the invention in conjunction with the claims and the attached drawing. The individual characteristics of the invention may be realized either individually by themselves or in any combinations of several characteristics in different embodiments of the invention.

DETAILED DESCRIPTION OF THE INVENTION

Figure 1:
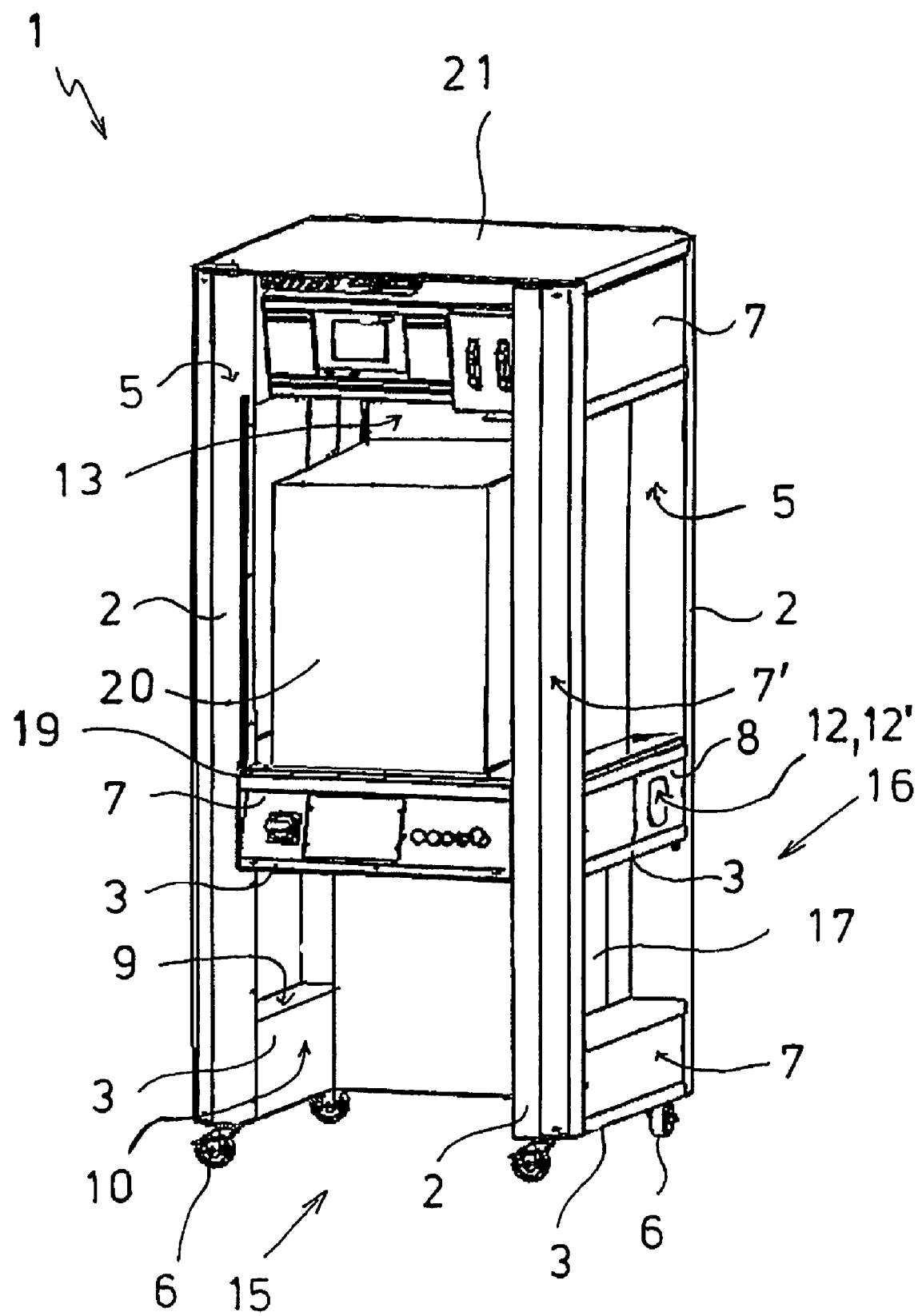
FIG. 1 shows a perspective view of a rack according to the invention for a test cell.
Figure 2:
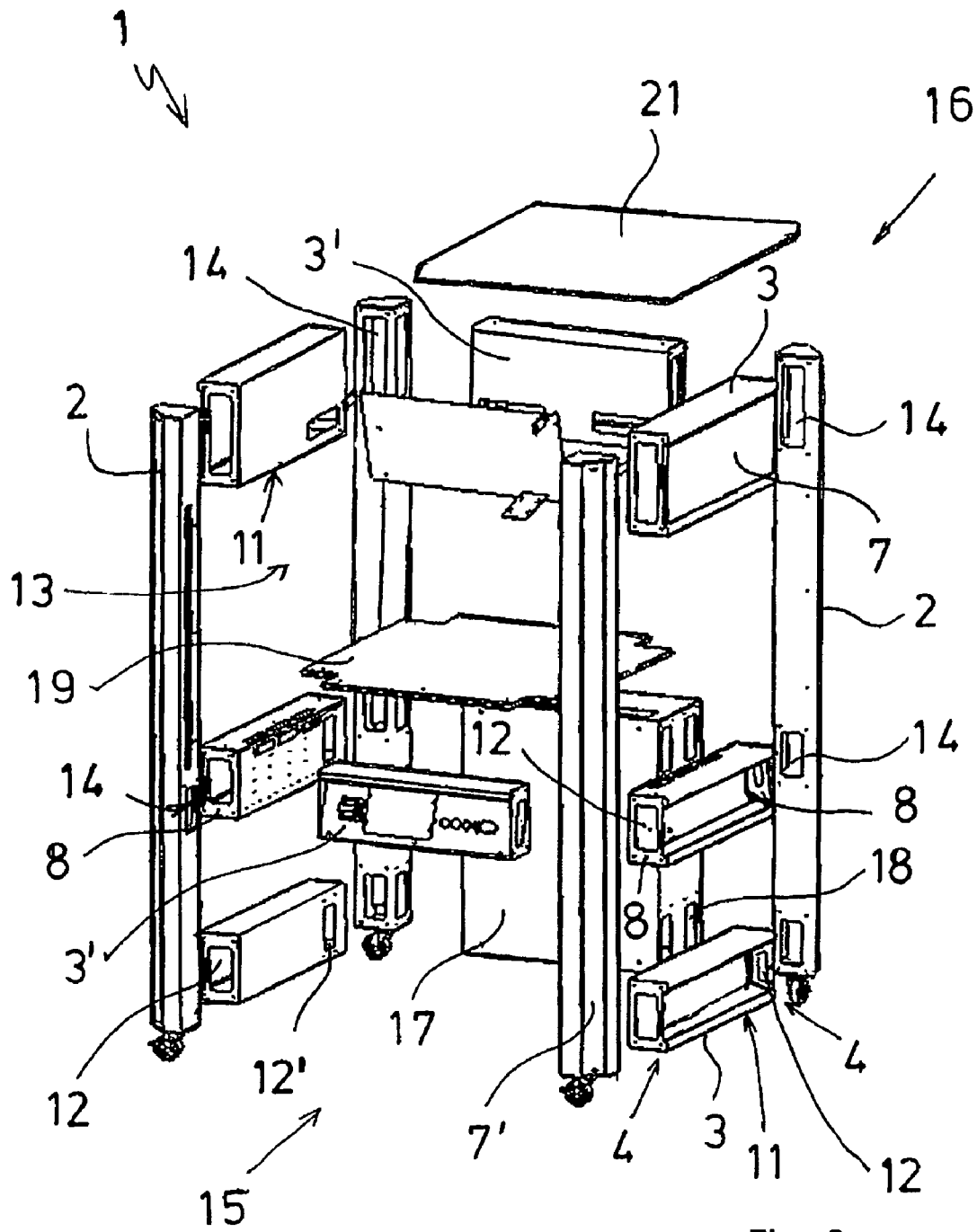
FIG. 2 shows an exploded view of the rack in FIG. 1.

The rack 1 according to the invention for a test cell shown in FIGS. 1, 2 comprises four vertical posts 2 as corner posts and one or several crossbars 3, 3' on each side that are located between the corner posts 2. At their ends 4, the crossbars 3, 3' are connected non-permanently with side walls 5 of the corner posts 2 by means of bolts and nuts (not shown). The rack 1 is supported by rollers mounted at the bottom of the corner posts 2. The corner posts 2 and the crossbars 3, 3' consist of box sections that are open towards the outside, forming cable channels, and are closed by means of removable covers 7, 7'.

The corner posts 2 and the crossbars 3, 3' are structural components of a modular system. For this purpose, the dimensions of the posts 2 and of the crossbars 3, 3' as well as the associated covers 7, 7' are standardized. Their standard lengths are based on standardized dimensions for common industrial housing sizes of electrical devices.

At their ends, the box sections of the crossbars 3, 3' are equipped with end plates 8 that are permanently connected with the side walls 9 and a rear wall 10 of the box sections. Together with the end plates 8, the box sections of the crossbars 3, 3' form box elements 11 that are open towards the outside. The end plates 8 of the box elements 11 each have a passage 12 for electrical, pneumatic, or hydraulic lines (not shown) to be installed in the box elements 11. In addition, the rear walls 10 of the box elements 11 that face the interior space 13 of the rack 1, with said box elements 11 serving as crossbars 3, 3', are equipped with additional passages 12' through which the lines from the box element 11 can pass into the interior space 13 of the rack 1.

With their end plates 8, the box elements 11 can only be attached to certain attachment points on the side walls 5 of the corner posts 2. At the attachment points for the box elements 11 that are arranged in a certain grid, passages 14—corresponding with the passages 12 of the end plates 8—are provided for running lines (not shown) from the posts 2 into the crossbars 3, 3'. The passages 12 in the end plates 8 are arranged congruently with the passages of the posts 2.

On each side of the rack 1, three box elements 11 serving as horizontal side crossbars 3 extend between a front side 15 and a rear side 16 of the rack 1. The side crossbars 3 are attached to the corner posts 2 at the bottom, at the top, and at approximately medium height. The corner posts 2 on the front side 15 are connected with two transverse crossbars 3'. The transverse crossbars 3' of the front side 15 are mounted at the height of the upper and middle side crossbars 3. On the rear side 16 of the rack 1, a transverse crossbar 3' is provided only at the top of the corner posts 2. Here, the lower transverse crossbar 3' is replaced by a control cabinet 17 whose width matches the length of the box elements 11.

The described number and arrangement of the crossbars 3, 3' and of the control cabinet 17 is not mandatory but may be varied due to the modular construction.

At its face side, the control cabinet is attached to the facing side walls 5 of the corner posts 2. It has passages 18 at the level of the lower and middle side crossbars 3 that are shaped and arranged congruently with the corresponding passages 14 of the posts 2 and one passage 12' of each side crossbar 3. Like the box elements 11, the control cabinet 17 is bolted with its face side to the corner post 2 of the rack 1.

At the level of the middle crossbars 3, 3', a support panel 19 with a testing apparatus 20 (shown schematically as a box) is installed. With outer edge areas, the support panel 19 rests on an upper side wall 9 of the box elements 11. Also, at the level of the upper crossbars 3, 3', a shelf panel for instruments (not shown) is provided. Like the support panel 19, the shelf panel 21 rests on the crossbars 3, 3'. In addition, the shelf panel 21 is supported on the upper face sides 22 of the posts 2. The support panel 19 as well as the shelf panel 21 are bolted to the crossbars 3, 3'.

With the covers 7, 7' removed, lines can be installed in the vertical posts 2 and in the horizontal crossbars 3, 3', leading from the control cabinet 17 to the testing apparatus 20 and/or the shelf panel 21 with the instruments. The lines are run through the passages 18, 14, 12, 12' of the control cabinet 17, the corner posts 2, and the crossbars 3, 3'. After closing the box sections by means of the covers 7, 7', the lines are invisible and protected, they do not pass towards the outside of the rack 1 from the posts 2 and the crossbars 3, 3', but only towards the interior of the rack 1 through the passages 12' in the rear walls of the crossbars 3, 3', and directly towards the testing apparatus 20 and to the instruments (not shown) on the shelf panel 21.

Further features of the invention can be found in the description of preferred embodiments of the invention in connection with the claims and the drawings. The single features can be realised alone or several together in embodiments of the invention.

The invention claimed is:

1. A rack for a test cell including:
   a plurality of vertical posts each formed as a box section defining an open-sided cable channel that opens towards an outside of the rack; and
   a plurality of C-shaped crossbars connected at opposite ends to respective ones of the vertical posts, each C-shaped crossbar being formed as a box section defining an open-sided cable channel that opens towards the outside of the rack, each C-shaped crossbar having a vertical rear wall facing an interior of the rack and upper and lower side walls respectively connected to a top and bottom of the rear wall, and each end of the C-shaped crossbar having an end plate fixed to the rear wall, upper side wall and lower side wall of the C-shaped crossbar;
   wherein each end plate includes an opening aligned with a corresponding opening in the respective vertical post forming a passage for lines.

2. A rack as claimed in claim 1, wherein the posts and/or the box elements have standard lengths.

3. A rack as claimed in claim 1, wherein the rack has a support panel with testing apparatus.

4. A rack as claimed in claim 1, where the rack has a shelf panel for instruments that is preferably located at a remote end of the posts in relation to the a floor.

5. A rack as claimed in claim 1, further including covers are provided for closing the box sections of the posts and of the crossbars that are open towards the outside.

6. A rack as claimed in claim 1, wherein the crossbars are connected with the vertical posts in a spatial grid.

7. A rack as claimed in claim 1, wherein each rear wall includes an opening forming a passage for lines from the cable channel of the crossbar to the interior of the rack.

8. A rack as claimed in claim 1, wherein the rack includes a control cabinet of standardized dimensions connected at opposite ends to respective vertical posts, the control cabinet having a cable channel and at least one opening in each end of the control cabinet, the openings being alignable with a corresponding opening in the respective vertical post forming a passage for lines.

9. A rack as claimed in claim 8, wherein the control cabinet includes at least two openings in each end of the control cabinet, one opening on each end being alignable with the corresponding opening in the respective vertical post and the other opening being alignable with a corresponding opening in a respective crossbar.

10. A rack as claimed in claim 1, wherein the vertical posts have a length longer than a width of the posts, and wherein the open-sided cables channel of the vertical posts extend substantially the entire length of the vertical posts.

11. A rack for a test cell including:
    a plurality of vertical posts each formed as a box section defining an open-sided cable channel that opens towards an outside of the rack; and
    a plurality of C-shaped crossbars connected at opposite ends to respective ones of the vertical posts, each C-shaped crossbar being formed as a box section defining an open-sided cable channel that opens towards the outside of the rack, each C-shaped crossbar having a vertical rear wall facing an interior of the rack and upper and lower side walls respectively connected to a top and bottom of the rear wall, and each end of the C-shaped crossbar having an end plate fixed to the rear wall, upper side wall and lower side wall of the C-shaped crossbar;
    wherein each rear wall includes an opening forming a passage for lines from the cable channel of the C-shaped crossbar to the interior of the rack.

12. A rack as claimed in claim 11, wherein the posts and/or the box elements have standard lengths.

13. A rack as claimed in claim 11, wherein the rack has a support panel with testing apparatus.

14. A rack as claimed in claim 11, where the rack has a shelf panel for instruments that is preferably located at a remote end of the posts in relation to a floor.

15. A rack as claimed in claim 11, further including covers are provided for closing the box sections of the posts and of the crossbars that are open towards the outside.

16. A rack as claimed in claim 11, wherein the crossbars are connected with the vertical posts in a spatial grid.

17. A rack as claimed in claim 11, wherein the rack includes a control cabinet of standardized dimensions connected at opposite ends to respective vertical posts, the control cabinet having a cable channel and at least one opening in each end of the control cabinet, the openings being alignable with a corresponding opening in the respective vertical post forming a passage for lines.

18. A rack as claimed in claim 11, wherein the control cabinet includes at least two openings in each end of the control cabinet, one opening on each end being alignable with the corresponding opening in the respective vertical post and the other opening being alignable with a corresponding opening in a respective crossbar.

19. A rack as claimed in claim 11, wherein the vertical posts have a length longer than a width of the posts, and wherein the open-sided cables channel of the vertical posts extend substantially the entire length of the vertical posts.

* * * * *